(12) United States Patent
Gluschenkov et al.

(10) Patent No.: US 7,084,024 B2
(45) Date of Patent: Aug. 1, 2006

(54) GATE ELECTRODE FORMING METHODS USING CONDUCTIVE HARD MASK

(75) Inventors: Oleg Gluschenkov, Poughkeepsie, NY (US); Dae-Gyu Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,642

(22) Filed: Sep. 29, 2004

(65) Prior Publication Data

US 2006/0068575 A1    Mar. 30, 2006

(51) Int. Cl.
*H01L 21/8238* (2006.01)

(52) U.S. Cl. ............... 438/199; 438/216; 438/233

(58) Field of Classification Search ............ 438/199, 438/200, 216, 218, 233
See application file for complete search history.

(56) References Cited

U.S. PATENT DOCUMENTS

| | | | |
|---|---|---|---|
| 5,888,588 A | 3/1999 | Nagabushnam et al. |
| 6,096,641 A | 8/2000 | Kunikiyo |
| 6,162,715 A | 12/2000 | Mak et al. |
| 6,204,073 B1 | 3/2001 | Nandakumar et al. |
| 6,274,484 B1 | 8/2001 | Tsai et al. |
| 6,340,629 B1 | 1/2002 | Yeo et al. |
| 6,426,301 B1 | 7/2002 | Shields et al. |
| 6,441,447 B1 | 8/2002 | Czagas et al. |
| 6,448,590 B1 | 9/2002 | Adkisson et al. |
| 6,633,497 B1 | 10/2003 | Nickel |
| 6,664,153 B1 | 12/2003 | Ang et al. |
| 6,693,333 B1 * | 2/2004 | Yu .................. 257/407 |
| 6,902,969 B1 * | 6/2005 | Adetutu et al. ........ 438/199 |
| 2002/0177279 A1 | 11/2002 | Adkisson, et al. |
| 2002/0196647 A1 | 12/2002 | Nickel |
| 2003/0104663 A1 | 6/2003 | Visokay et al. |
| 2003/0109121 A1 | 6/2003 | Rotondaro |
| 2003/0153139 A1 | 8/2003 | Ang et al. |

OTHER PUBLICATIONS

"A Model of Bonding and Band-forming For Oxides And Nitrides", by Chang Sun, 1998 The American Institute of Physics, Applied Physics Letters, vol. 72, No. 14, Apr. 6, 1998, pp. 1706-1708.

(Continued)

*Primary Examiner*—Walter L. Lindsay, Jr.
(74) *Attorney, Agent, or Firm*—Lisa U. Jaklitsch; Hoffman, Warnick & D'Alessandro LLC

(57) ABSTRACT

Methods related to formation of a gate electrode are disclosed that employ a conductive hard mask as a protective layer during a photoresist removal process. In preferred embodiments, the conductive hard mask includes a metal containing conductor or a metal silicide. The invention prevents process damage on the gate dielectric during wet and/or dry resist strip, and since the conductive hard mask cannot be etched in typical resist strip chemistries, the invention also protects a metal electrode under the hard mask. The steps disclosed allow creation of a multiple work function metal gate electrode, or a mixed metal and polysilicon gate electrode, which do not suffer from the problems of the related art.

5 Claims, 4 Drawing Sheets

OTHER PUBLICATIONS

"Theory Of Bonding In Transition-metal Carbides And Nitrides", by J. Haglung, 1993 The American Physical Society, Physical Review B, vol. 48, No. 16, Oct. 15, 1993 pp. 685-691.

Chau, R., et al., "Gate Dielectric Scaling for High-Performance CMOS: from SiO2 to High-K," International Workshop on Gate Insulator 2003, Tokyo, Japan, Nov. 2003, pp. 124-126.

"Intel's High-k/Metal Gate Announcement," www.cse.psu.edu/-cg477/sp04/misc/highK.pdf, Nov. 2003, pp. 1-17.

Park, D.-G, et al., "Thermally Robust Dual-Work Function ALD-MNx MOSFETs Using Conventional CMOS Process Flow," 2004 Symposium on VLSI Technology, Digest of Technical Papers, pp. 186-187.

* cited by examiner

GATE ELECTRODE FORMING METHODS USING CONDUCTIVE HARD MASK

BACKGROUND OF INVENTION

1. Technical Field

This invention relates to the manufacture of advanced semiconductor devices, and more particularly, to a method related to formation of a gate electrode that employs a conductive hard mask as a protective layer during a photoresist removal process for multiple work function gate structures.

2. Related Art

The ongoing reduction in size of electronic device elements poses problems in device performance that must be addressed using new materials and fabrication techniques. In the case of gate structures for high-performance complementary metal-oxide semiconductor (CMOS) devices, the equivalent oxide thickness of the gate dielectric has been reduced to about 1.2 nm. A typical CMOS gate structure is shown schematically in FIG. 1. Gate structure 10 is fabricated on the surface of a substrate 12, which has source and drain regions 14, 16 formed therein. Gate structure 10 includes conducting element 18 (typically polysilicon; p+ doped and n+ doped in PFETs and NFETs, respectively) overlying dielectric layer 20. If a conventional oxynitride gate dielectric is used, decreasing the thickness below about 1.2 nm (physical thickness of the dielectric) causes the gate leakage current to become unacceptably high. In a structure such as shown in FIG. 1, the total gate electrical thickness may be viewed as having three components: the equivalent oxide thickness of the gate dielectric (about 1.2 nm), the quantum-mechanical effect of the substrate (about 0.4 nm), and the polysilicon depletion effect (about 0.3 to 0.4 nm). With present-day gate dielectric thicknesses, the polysilicon depletion effect accounts for a substantial component of the total gate electrical thickness. The polysilicon depletion effect comes about when the gate is turned on and a region devoid of free charge forms at the polysilicon/dielectric interface (interface 20A in FIG. 1). The appearance of this depletion region reduces the capacitance of the gate and thus increases the electrical thickness. If the polysilicon depletion region could be eliminated, the electrical dielectric thickness would be reduced with no substantial increase in the leakage current. This would permit improved device performance without a further reduction in the thickness of the gate dielectric 12.

Linewidths are also being reduced to less than 65 nm. In the case of CMOS, this means that the lateral extent of gate structure 10 is now in the sub-65 nm range. If a gate structure about this size is designed with a gate dielectric equivalent thickness of about 1 nm, a conventional oxynitride gate dielectric can no longer be used due to unacceptably high leakage currents. It then becomes necessary to substitute high-k gate dielectric materials for the conventional gate oxide or oxynitride, which serves to lower the gate leakage current by 4 to 5 orders of magnitude while having similar equivalent oxide thickness. However, the combination of polysilicon for gate conductor 18 with a high-k material for gate dielectric 20 presents further problems. As is understood by those skilled in the art, interactions between the materials can cause a shift in the threshold voltage $V_t$ due to pinning of the Fermi level in the gate conductor. In particular, an increased $V_t$ may prevent proper function in a PFET. Another problem affecting PFET performance is that of penetration of boron from the p+ type polysilicon into the high-k dielectric and possibly into the channel region of the device, which renders the device unusable. In addition, the boron diffusion also interferes with hafnium containing high-k dielectrics.

Accordingly, in a PFET device (at least) it is desirable to eliminate the polysilicon from the gate structure (or at least remove the polysilicon from contact with the gate dielectric), as several benefits may be obtained. The elimination of the polysilicon depletion effect would decrease the effective electrical thickness of the gate dielectric. Interactions between the polysilicon and gate dielectric materials would be avoided, which in turn would avoid the problem of boron penetration. This would lead to faster devices that consume less power.

Recently there has been substantial interest in replacing polysilicon gate conductors with metal gate electrodes, so that gate conductor 18 is a metal in both NFET and PFET devices. In order to provide appropriate threshold voltages in the two types of devices, two different metals are typically needed. In addition, the NFET and PFET require metals with different work functions. The "work function" of a material is a measurement of how much energy is required to extract an electron from the material by moving the electron in the solid from the Fermi level to the vacuum level, i.e., to outside of the solid. Generally, an NFET device should have a gate work function in the range 4.1 to 4.3 eV, and a PFET device should have a gate work function over 5.0 eV. Furthermore, the interface 12A between the metal and the gate dielectric should be stable during the high-temperature processing steps in the fabrication of the CMOS devices.

There are two possible integration approaches for metal gate conductors in CMOS; these are referred to as the conventional processing approach and the replacement gate approach. In the conventional processing approach, the metal is in contact with the gate dielectric during the high-temperature (above 1000° C.) activation annealing steps for the dopants in the source and drain regions. The metal must not interact with the dielectric material during the annealing steps. In the replacement gate approach, the CMOS structure is first formed with polysilicon gate electrodes. After all of the high-temperature processing steps, the polysilicon and gate dielectric are removed and a new dielectric is formed, followed by deposition of the metal gate conductor. With this approach the metal/dielectric interface needs to be stable only up to about 500° C. In either process flow, in order to create two gate materials with different work functions, one has to selectively remove the first gate material from the area designated for the second material. This selective removal can be easily accomplished with the aid of standard photolithography techniques where the first material is selectively protected by a photoresist mask in the first area and is selectively removed in the second area. After selective gate material removal, the photoresist mask is stripped. Unfortunately, current technology implements such a photoresist strip with the aid of an oxidizing ambient (e.g. oxygen or ozone plasma) and/or an oxidizing chemical solution (e.g. a solution of sulfuric acid ($H_2SO_4$) with oxidizing peroxide $H_2O_2$). Presence of oxidizers (dry or wet) can substantially thicken the exposed gate dielectric which leads to a substantial degradation of performance. The absence of oxidizing agents in the resist strip can lead to a defective layer formation in the gate dielectric and the gate electrode. For example, the non-oxidizing solvent resist strip can create impurity contamination like carbon on a gate oxide and incomplete uniform resist strip. In addition, typical metal gate electrode materials (e.g., tungsten nitride (WNx), titanium nitride (TiN), hafnium nitride (HfN) or zirconium nitride (ZN)) can be easily etched out by chemicals such as a mixture of sulfuric acid ($H_2SO_4$) and/or peroxide ($H_2O_2$) during photoresist strip. Accordingly, the first gate material can be also damaged during a typical photoresist strip process.

In view of the foregoing, there is a need in the art for a method that does not suffer from the problems of the related art.

SUMMARY OF INVENTION

The invention includes methods related to formation of a gate electrode that employ a conductive hard mask as a protective layer during a photoresist removal process. In preferred embodiments, the conductive hard mask includes a metal containing conductor or a metal silicide. The invention prevents process damage on the gate dielectric during wet and/or dry resist strip, and since the conductive hard mask cannot be etched in typical resist strip chemistries, the invention also protects a metal electrode under the hard mask. The steps disclosed allow creation of a multiple work function metal gate electrode, or a mixed metal and polysilicon gate electrode, which do not suffer from the problems of the related art.

A first aspect of the invention is directed to a method for preparing an area for fabrication of a metal gate electrode with multiple work functions, the method comprising the steps of: depositing a material having a first work function; forming a conductive hard mask including one of a metal containing conductor and a metal silicide over the material; using a photoresist mask to remove the conductive hard mask from an area for a device having a second, different work function selective to the material; and removing the photoresist mask, leaving the conductive hard mask for use in removing the material from the area and inclusion in the metal gate electrode.

A second aspect of the invention is directed to a method of forming a gate electrode, the method comprising the steps of: forming a gate dielectric; depositing a first metallic conductor having a first work function; depositing a conductive hard mask on the first metallic conductor including one of a conductor and a metal silicide; removing the conductive hard mask from an area for a particular device type using a photoresist mask selective to the first metallic conductor; removing the photoresist mask; removing the first metallic conductor in the area with the conductive hard mask protecting the first metallic conductor; depositing a conductor; and forming the gate electrode.

A third aspect of the invention is directed to a method of forming a metal gate electrode with multiple work function, the method comprising the steps of: depositing a dielectric on a substrate; depositing a first metallic conductor having a first work function over the dielectric; depositing a conductive hard mask on the first metallic conductor including one of a conductor and a metal silicide; removing the conductive hard mask from an area for a particular device type using a photoresist mask; removing the photoresist mask to a remaining portion of the conductive hard mask; removing the first metallic conductor in the area using the conductive hard mask to protect the first metallic conductor; depositing a second metal having a second, different work function in the area; depositing a silicon-containing conductor over the first and second metals; and forming the metal gate electrode.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

With reference to the accompanying drawings, the invention will be described in terms of a method for creating a metal gate electrode with multiple work functions. It should be recognized, however, that other inventive methods are included within this method, as denoted by the appended claims.

Figure 1:
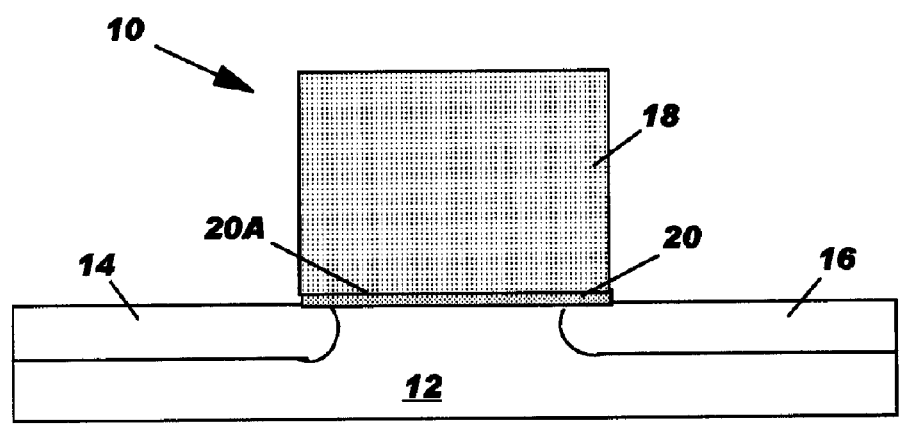
FIG. 1 shows a conventional CMOS device.
Figure 2:
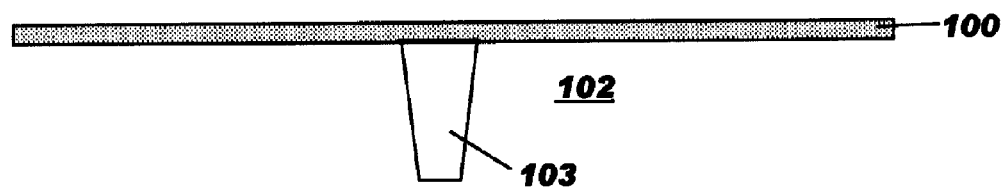
FIG. 2–7, 8A and 8B show steps of the methods related to formation of a gate electrode that employ a conductive hard mask or metal silicide film as a selective etch stop during a photoresist removal process according to the invention.

Referring to FIG. 2, in a first step of the method, a dielectric 100 is formed upon a substrate 102, which may include shallow trench isolation (STI) 103. Substrate 102 can also include other useful structures which are not essential to the instant invention and not shown for clarity. Such useful structures may include but are not limited to: buried dielectric layers and buried interconnects, memory cells, trench capacitors, and stress inducing layers and structures. Dielectric 100 may be deposited in any now known or later developed fashion such as by a combination of thermal nitridation and oxidation, or an atomic layer deposition (ALD). Dielectric 100 may include any conventional or later developed material such as hafnium oxide (HfO), hafnium silicate ($HfSiO_x$), hafnium silicon oxynitride (HfSiON), titanium oxide ($TiO_x$), titanium oxinitride (TiON), titanium silicon oxynitride (TiSiON) or aluminium oxide (AlO), aluminium nitride (AlN), zirconium oxide (ZO), and their combined stacks, etc. In accordance with conventional practice, dielectric 100 is deposited as thin as possible, e.g., 1.2 nm for silicon oxynitride gate dielectrics, less than about 1.0 nm for underlying silicon oxynitride films in various high-k based gate dielectric stacks, and less than about 2.5 nm for high-k films (those with dielectric permittivity k larger than 7) in high-k based gate dielectric stacks.

Figure 3:
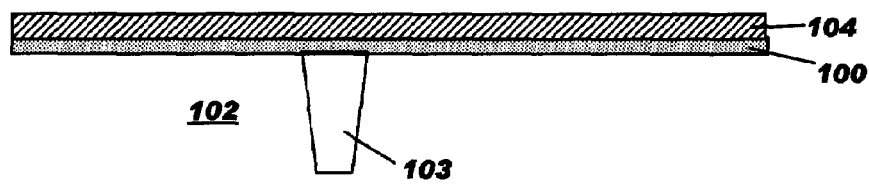

Next, as shown in FIG. 3, a first material 104 is deposited having a first work function (wf1) over dielectric 100. In one embodiment, first material 104 is a first metallic conductor. The particular metallic conductor used can be any metal or metallic compound used for semiconductor gate electrodes such as tungsten, molybdenum, aluminum, etc. However, in one preferred embodiment, first metallic conductor includes a metal nitride, such as tungsten nitride ($WN_x$), titanium nitride (TiN), titanium aluminum nitride (TiAlN), tantalum nitride ($TaN_x$), tantalum aluminum nitride (TaAlN), tantalum silicon nitride (TaSiN), hafnium nitride (HfN) or zirconium nitride (ZN), each of which has a work function similar to p-type polysilicon. First metallic conductor 104 may be formed, for example, by atomic layer deposition.

Figure 4:
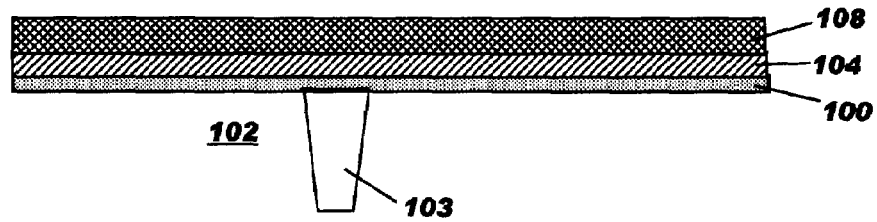

Next, as shown in FIG. 4, a conductive hard mask 108 is deposited on first metallic conductor 104. In preferred embodiments, conductive hard mask 108 includes a metal containing conductor or a metal silicide. If a metal silicide is used, it may include, for example, tungsten silicide (WSi), titanium silicide (TiSix), tantalum silicide (TaSix), cobalt silicide ($CoSi_x$) or nickel silicide (NiSi). The metallic element in the metal silicide may also be part of first metallic conductor 104, however, this is not necessary. For instance, first metallic conductor 104 can be tungsten nitride (WN) while conductive hard mask 108 can be comprised from tungsten silicide (WSi) sharing the same metallic element "tungsten" with first metallic conductor 104 or, alternatively, conductive hard mask 108 can be comprised from cobalt silicide. In the alternative embodiment, the conductive hard mask layer 108 can include a metal containing conductor such as tantalum nitride (TaN) or tantalum silicon nitride (TaSiN). In this case, conductive hard mask 108 also coincidentally may have a work function similar to that of p-type polysilicon. Conductive hard mask 108 has a thickness of preferably no less than 10 Å and no greater than 500 Å, and more preferably of no less than 20 Å and no greater than 250 Å. As will be described below, conductive hard mask 108 is a good etch stop layer with respect to typical chemistries used to remove typical metallic layers (e.g., tungsten, aluminum) as well as photoresist layers, but provides a good conductive element when left in the structure. Conductive hard mask 108 can be formed by any now known or later developed process such as atomic layer deposition (ALD) (preferred), chemical vapor deposition (CVD), plasma-enhanced CVD, physical vapor deposition (PVD), laser deposition, thermal reaction of elemental metal with a silicon-containing layer, etc.

Figure 5:
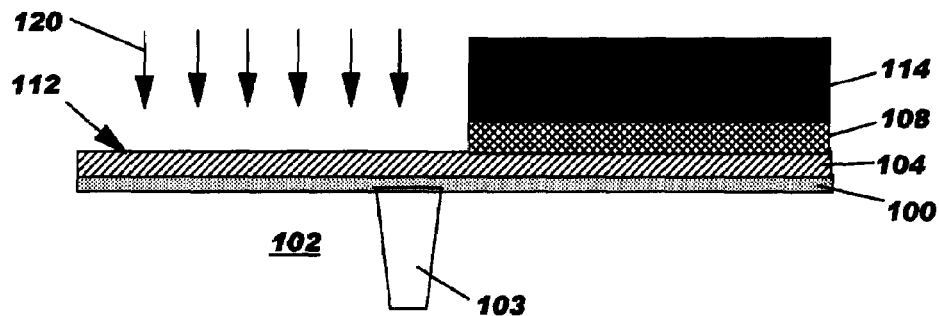

Next, as shown in FIG. 5, conductive hard mask 108 is removed from an area 112 for a particular device type using a photoresist mask 114, e.g., where a second metal rather than first metallic conductor 104 will be used. Photoresist mask 114 may include any conventional mask material and be applied by any conventional technique, e.g., apply, develop and pattern. The removal step shown may include conducting a wet etch or a reactive ion etch 120 (preferred) selective to first metallic conductor 104. Either etch process 120 does not damage first metallic conductor 104. In this case, photoresist mask 114 is used to remove conductive hard mask 108 from area 112 selective to first metallic conductor 104. As will be described below, area 112 will eventually include a device having a second, different work function (wf2).

Figure 6:
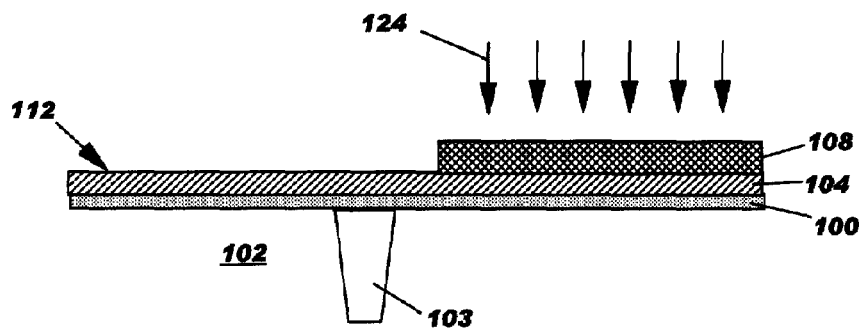

Next, as shown in FIG. 6, photoresist mask 114 (FIG. 5) is removed to a remaining portion of conductive hard mask 108. That is, conductive hard mask 108 remains for inclusion in a metal gate electrode (200, 204 in FIGS. 9A, 9B, respectively) to be subsequently formed. This step preferably includes a wet etch 124 using a chemistry including at least sulfuric acid ($H_2SO_4$) and/or peroxide ($H_2O_2$), i.e., a non-hydrofluoric acid etch. This step may also include using oxygen plasma with the wet chemistry. In conventional processing, conductive hard mask 108 would not be present on first metallic conductor 104, which would allow this step to damage dielectric 100 under first metallic conductor 104, which is very sensitive to any contamination. Conductive hard mask 108 is also beneficial during any chemical trim processes (not shown) that may be conducted post photoresist mask 114 (FIG. 5) removal since it also prevents etching out of first metallic conductor 104 thereunder. Furthermore, first metallic conductor 104 protects dielectric 100 against plasma damage or oxide re-growth, which could occur during conventional metal RIE or plasma photoresist removal.

Figure 7:
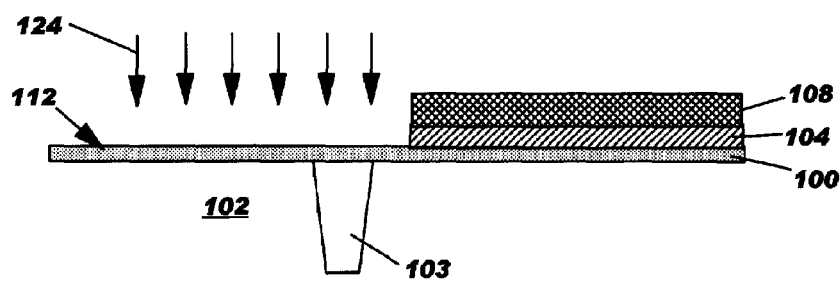

As shown in FIG. 7, the next step includes removing first metallic conductor 104 in area 112 using conductive hard mask 108 to protect first metallic conductor 104 thereunder. This step may include continued use of wet etch 124.

Figure 8A:
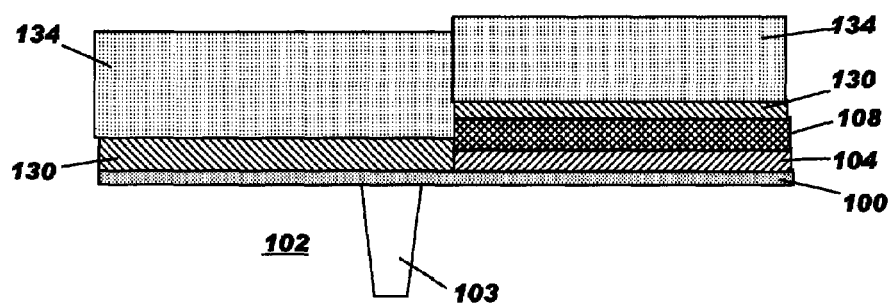
Figure 8B:
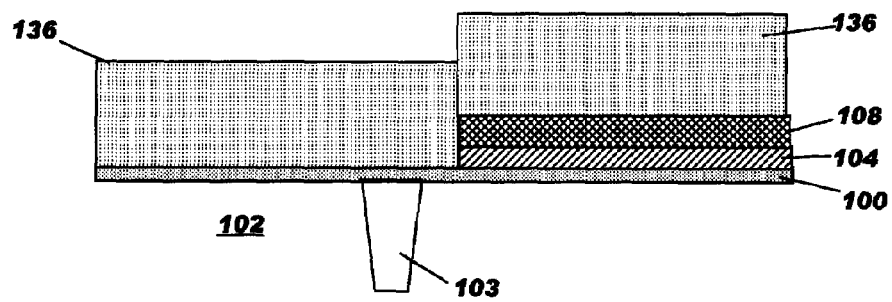
Figure 9A:
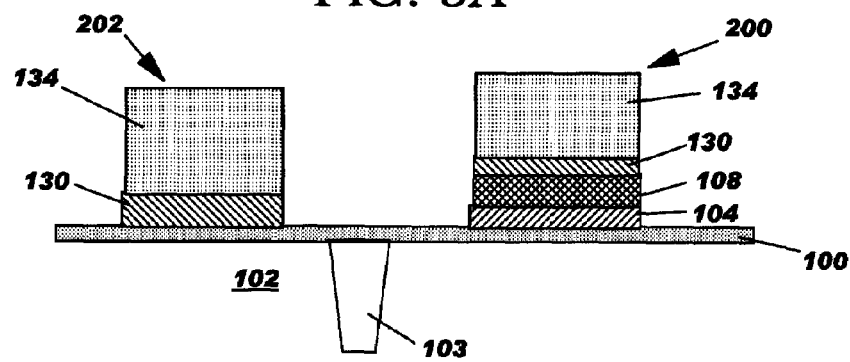
FIGS. 9A–9B show gate electrodes formed according to the methods of FIGS. 2–7, 8A and 8B.

The next step, shown in FIGS. 8A–B, includes depositing a conductor. This step can be fulfilled in a number of ways to generate a number of different structures. In one embodiment, shown in FIG. 8A, a second metallic conductor 130 having a second, different work function (wf2) than first metallic conductor 104 is deposited, followed by depositing of a silicon-containing conductor 134 over second metallic conductor 130. This embodiment allows for formation of a dual work function metal gate electrode 202, 204 (FIG. 9A). For example, first metallic conductor 104 may include a metal nitride such as tungsten nitride (WNx), which has a work function close to p-type polysilicon, and second metallic conductor 130 may include tantalum nitride (TaN) or tantalum silicon nitride (TaSiN), each of which has a work function close to n-type polysilicon.

Figure 9B:
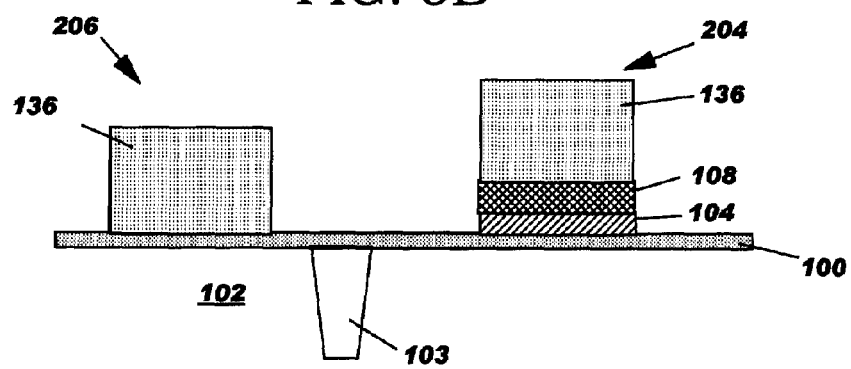

In an alternative embodiment, shown in FIG. 8B, just a silicon-containing conductor 136 is deposited. This embodiment allows for formation of a metal PFET with a p-type metal 204 (FIG. 9B) and an n+ polysilicon NFET 206 (FIG. 9B). The p-type metal used as the first metallic conductor 104 may be, for example, a metal nitride such as tungsten nitride ($WN_x$), which has a work function close to p-type polysilicon. The n-type polysilicon of the NFET does not pose the dopant diffusion problems exhibited by the p-type polysilicon, and thus can still be used effectively. In either of the above-described embodiments, a highly doped p-type polysilicon that creates dopant diffusion problems is replaced with a p-type metal (metal nitride) device, which removes the dopant (boron) diffusion problem. In addition, the metal PFET 200 (FIG. 9A) or 204 (FIG. 9B) also prevents interference with a dielectric 100 including hafnium (Hf).

A final step, shown in FIGS. 9A–9B, includes forming the gate electrodes using conventional techniques, e.g., masking, lithography, etching, etc. FIG. 9A corresponds to the structure of FIG. 8A and may include a first p-type metal gate electrode 200 (PFET) and a second n-type metal gate electrode 202 (NFET). FIG. 9B corresponds to FIG. 8B and may include a first p-type metal gate electrode 204 (PFET) and a second n-type polysilicon gate electrode 206 (NFET).

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method of forming a metal gate electrode with multiple work function, the method comprising the steps of:
   depositing a dielectric on a substrate;
   depositing a first metallic conductor having a first work function over the dielectric;
   depositing a conductive hard mask on the first metallic conductor including at least one of a metal containing conductor and a metal silicide;
   removing the conductive hard mask from an area for a particular device type using a photoresist mask;
   removing the photoresist mask to a remaining portion of the conductive hard mask;
   removing the first metallic conductor in the area using the remaining portion of the conductive hard mask to protect the first metallic conductor;

depositing a second metal having a second, different work function in the area;

depositing a silicon-containing conductor over the first and second metals; and forming the metal gate electrode including the remaining portion of the conductive hard mask.

2. The method of claim 1, wherein the metal silicide includes one of tungsten silicide (WSi), titanium silicide (TiSi$_x$), tantalum silicide (TaSi$_x$), nickel silicide (NiSi), cobalt silicide (CoSi$_x$), and the metal containing conductor includes one of tantalum nitride (TaN), tantalum silicon nitride (TaSiN).

3. The method of claim 1, wherein the conductive hard mask has a thickness of no less than 10 Å and no greater than 500 Å.

4. The method of claim 3, wherein the conductive hard mask has a thickness of no less than 20 Å and no greater than 250 Å.

5. The method of claim 1, wherein the conductive hard mask removing step includes conducting one of a wet etch and a reactive ion etch.

* * * * *